(12) United States Patent
Watanabe et al.

(10) Patent No.: US 9,188,600 B2
(45) Date of Patent: Nov. 17, 2015

(54) METHOD FOR MANUFACTURING PHYSICAL QUANTITY DETECTOR, AND PHYSICAL QUANTITY DETECTOR

(75) Inventors: Jun Watanabe, Matsumoto (JP);
Kazuyuki Nakasendo, Shiojiri (JP);
Takahiro Kameta, Okaya (JP)

(73) Assignee: Seiko Epson Corporation (JP)

( * ) Notice: Subject to any disclaimer, the term of this patent is extended or adjusted under 35 U.S.C. 154(b) by 483 days.

(21) Appl. No.: 13/477,529

(22) Filed: May 22, 2012

(65) Prior Publication Data

US 2012/0304769 A1 Dec. 6, 2012

(30) Foreign Application Priority Data

May 30, 2011 (JP) ................................. 2011-120050

(51) Int. Cl.
*H05K 3/36* (2006.01)
*G01P 15/08* (2006.01)
*G01P 15/09* (2006.01)
*G01P 15/097* (2006.01)
*H05K 3/46* (2006.01)

(52) U.S. Cl.
CPC ............ *G01P 15/0802* (2013.01); *G01P 15/097* (2013.01); *G01P 15/0922* (2013.01); *G01P 2015/0828* (2013.01); *H05K 3/4623* (2013.01); *Y10T 29/49002* (2015.01); *Y10T 29/49124* (2015.01); *Y10T 29/49126* (2015.01); *Y10T 29/49817* (2015.01)

(58) Field of Classification Search
CPC . H01L 21/6835; H01L 21/78; G01P 15/0802; G01P 15/0922; G01P 15/097; G01P 2015/0828; Y10T 29/49817; Y10T 29/49815; Y10T 29/49; Y10T 29/49002; Y10T 29/42; Y10T 29/49124; Y10T 29/49126; Y10T 29/4913; Y10T 29/49103
USPC .......... 29/426.2, 426.1, 592, 26.35, 829, 830, 29/832, 621.1, 847, 884, 840, 25.03, 29/25.35; 438/15, 25, 50, 52, 67, 461, 438/464; 73/514.01
See application file for complete search history.

(56) References Cited

U.S. PATENT DOCUMENTS 4,706,374 A * 11/1987 Murakami ...................... 438/52
4,882,933 A * 11/1989 Petersen et al. ............ 73/514.13
5,644,083 A    7/1997 Newell et al.

(Continued)

FOREIGN PATENT DOCUMENTS

JP     57-069246 U    10/1980
JP     64-041145 U    3/1989

(Continued)

*Primary Examiner* — Peter DungBa Vo
*Assistant Examiner* — Azm Parvez
(74) *Attorney, Agent, or Firm* — Harness, Dickey & Pierce, P.L.C.

(57) ABSTRACT

A method for manufacturing a physical quantity detector is for a physical quantity detector including a flat frame-like base part, a flat plate-like moving part which is arranged inside the base part and has one end thereof connected to the base part via a joint part, and a physical quantity detection element laid on the base part and the moving part. The method includes: integrally forming the base part, the joint part, the moving part, and a connecting part which is provided on a free end side of the moving part and connects the base part and the moving part to each other; laying and fixing the physical quantity detection element on the base part and the moving part; and cutting off the connecting part.

7 Claims, 9 Drawing Sheets

(56) References Cited

U.S. PATENT DOCUMENTS

| | | |
|---|---|---|
| 5,755,978 A | 5/1998 | Newell et al. |
| 6,263,735 B1 | 7/2001 | Nakatani et al. |
| 2008/0229566 A1 | 9/2008 | Saito |

FOREIGN PATENT DOCUMENTS

| | | |
|---|---|---|
| JP | 08-054411 | 2/1996 |
| JP | 2000-304765 A | 11/2000 |
| JP | 2004-133108 A | 4/2004 |

* cited by examiner

METHOD FOR MANUFACTURING PHYSICAL QUANTITY DETECTOR, AND PHYSICAL QUANTITY DETECTOR

BACKGROUND

1. Technical Field

The present invention relates to a method for manufacturing a physical quantity detector.

2. Related Art

Some acceleration detectors as physical quantity detectors are configured to utilize, for example, a phenomenon that the resonance frequency of a piezoelectric resonator element changes when a force in the direction of a detection axis acts on the piezoelectric resonator element, to detect acceleration applied to the acceleration detector based on this change in resonance frequency.

For example, JP-A-8-54411 discloses an accelerometer (acceleration detector) which has a double-ended tuning fork-type piezoelectric resonator element bonded to one of opposite angles of a frame-shaped parallelogram frame and is configured to apply a compressive force or tensile force to the other of the opposite angles, and a manufacturing method for the same.

The acceleration detector of JP-A-8-54411 includes a substantially flat plate-like center element including a fixed part and a moving part (vibrating mass) connected to the fixed part via a hinge and rotatable about the hinge, and a pair of substantially flat plate-like transducer elements which are welded to both sides of the center element and each of which has a double-ended tuning fork-type piezoelectric resonator element incorporated therein (see JP-A-8-54411, FIG. 3).

The acceleration detector is configured to detect acceleration from a difference in resonance frequency (frequency difference) changing in accordance with the acceleration applied, between the pair of double-ended tuning fork-type piezoelectric resonator elements.

According to the manufacturing method of JP-A-8-54411, in the acceleration detector, the center element is held on a wafer, during the manufacturing, via a separation tab provided on the outside of a placement ring situated on an outer perimeter. After the manufacturing, the separation tab becomes broken, thus separating the center element from the wafer.

However, according to the manufacturing method of JP-A-8-54411, a free end side of the moving part (vibrating mass) on the inside of the placement ring, of the center element, is rotatable (displaceable) about the hinge during the manufacturing.

Thus, according to the manufacturing method of JP-A-8-54411, the moving part and the hinge of the center element of the acceleration detector may become damaged by an external force applied, for example, when shaping by wet etching is carried out or when the pair of transducer elements is welded.

SUMMARY

An advantage of some aspects of the invention is to solve at least a part of the problems described above, and the invention can be implemented as the following forms or application examples.

APPLICATION EXAMPLE 1

This application example is directed to a method for manufacturing a physical quantity detector including a flat frame-like base part, a flat plate-like moving part which is arranged inside the base part and has one end thereof connected to the base part via a joint part, and a physical quantity detection element laid on the base part and the moving part across the joint part. The method includes: integrally forming the base part, the joint part, the moving part, and a connecting part which is provided on the other end side of the moving part as a free end thereof and connects the base part and the moving part to each other; laying and fixing the physical quantity detection element on the base part and the moving part; and cutting off the connecting part.

According to this application example, the method for manufacturing the physical quantity detector includes: integrally forming the base part (equivalent to a fixed part), the joint part (equivalent to a hinge), the moving part, and the connecting part; laying and fixing the physical quantity detection element on the base part and the moving part; and cutting off the connecting part.

Thus, according to the method for manufacturing the physical quantity detector, flexure of the moving part due to an external force applied in manufacturing processes can be restrained by the connecting part, and damage to the moving part and the joint part in the manufacturing processes can be reduced. Thus, productivity of the physical quantity detector can be improved.

APPLICATION EXAMPLE 2

In the method for manufacturing the physical quantity detector according to above application example, it is preferable that the cutting of the connecting part is carried out after the laying and fixing of the physical quantity detection element on the base part and the moving part.

According to this application example, in the method for manufacturing the physical quantity detector, the cutting of the connecting part is carried out after the laying and fixing the physical quantity detection element on the base part and the moving part. Therefore, flexure of the moving part due to an external force applied when the physical quantity detection element is laid and fixed on the base part and the moving part can be restrained by the connecting part.

Consequently, damage to the moving part and the joint part when the physical quantity is laid and fixed on the base part and the moving part can be reduced and productivity of the physical quantity detector can be improved.

Application Example 3

In the method for manufacturing the physical quantity detector according to above application example, it is preferable that the connecting part is made thinner than the base part and the moving part.

According to this application example, in the method for manufacturing the physical quantity detector, the connecting part is made thinner than the base part and the moving part. Therefore, the connecting part can be cut off easily without adversely affecting the base part and the moving part in the cutting of the connecting part.

APPLICATION EXAMPLE 4

In the method for manufacturing the physical quantity detector according to above application example, it is preferable that the connecting part is processed only on one side thereof and thus made thinner than the base part and the moving part.

According to this application example, in the method for manufacturing the physical quantity detector, the connecting part is processed only on one side thereof and thus made thinner than the base part and the moving part. Therefore, the connecting part can be formed more easily than in the case of processing both sides thereof.

APPLICATION EXAMPLE 5

In the method for manufacturing the physical quantity detector according to above application example, it is preferable that the connecting part is formed to have a narrow part on the base part side and a narrow part on the moving part side.

According to this application example, in the method for manufacturing the physical quantity detector, the connecting part is formed to have a narrow part on the base part side and a narrow part on the moving part side. Thus, the connecting part can be cut off at the two narrow parts having less strength than the peripheries and therefore a predetermined space (gap) can be secured between the base part and the moving part.

Consequently, in the method for manufacturing the physical quantity detector, interference between the base part and the moving part when the moving part is displaced can be avoided securely.

APPLICATION EXAMPLE 6

In the method for manufacturing the physical quantity detector according to above application example, it is preferable that the narrow parts of the connecting part are formed in such a way as to cut into the base part and the moving part as viewed in a plan view.

According to this application example, in the method for manufacturing the physical quantity detector, the narrow parts of the connecting part are formed in such a way as to cut into the base part and the moving part as viewed in a plan view. Therefore, the remaining part of the connecting part after the cutting can be prevented from protruding from the outer shape of the base part and the moving part.

Consequently, in the method for manufacturing the physical quantity detector, the remaining part of the connecting part after the cutting does not affect the space between the base part and the moving part (i.e., the space between the base part and the moving part does not depend on the position of the remaining part after the cutting). Therefore, a predetermined space can be reliably secured between the base part and the moving part.

Thus, in the method for manufacturing the physical quantity detector, interference between the base part and the moving part when the moving part is displaced can be avoided more securely.

APPLICATION EXAMPLE 7

In the method for manufacturing the physical quantity detector according to above application example, it is preferable that the connecting part is formed in such a way as to overlap a center line along a direction connecting the moving part and the base part, on the moving part, as viewed in a plan view.

According to this application example, in the method for manufacturing the physical quantity detector, the connecting part is formed in such a way as to overlap a center line along a direction connecting the moving part and the base part, on the moving part, as viewed in a plan view. Therefore, good supporting balance of the moving part by the connecting part is achieved.

Consequently, in the method for manufacturing the physical quantity detector, the moving part is harder to flex than in the case where the connecting part does not overlap the center line. Therefore, damage to the moving part and the joint part in the manufacturing processes can be reduced securely.

BRIEF DESCRIPTION OF THE DRAWINGS

The invention will be described with reference to the accompanying drawings, wherein like numbers reference like elements.

FIG. 2A is a plan view. FIG. 2B is a sectional view taken along line A-A in FIG. 2A.

FIG. 3A shows a state where a moving part is displaced downward in the drawing (−Z direction). FIG. 3B shows a state where the moving part is displaced upward in the drawing (+Z direction).

FIG. 5A is a plan view. FIG. 5B is a sectional view taken along line A-A in FIG. 5A.

FIG. 6A is a plan view. FIG. 6B is a sectional view taken along line A-A in FIG. 6A.

FIG. 7A is a plan view. FIG. 7B is a sectional view taken along line A-A in FIG. 7A. FIG. 7C is an enlarged view of a section C in FIG. 7A.

FIG. 8A is a plan view. FIG. 8B is a sectional view taken along line A-A in FIG. 8A.

DESCRIPTION OF EXEMPLARY EMBODIMENTS

Hereinafter, a specific embodiment of the invention will be described with reference to the drawings.

Embodiment

First, an example of the configuration of a physical quantity detector will be described.

Figure 1:
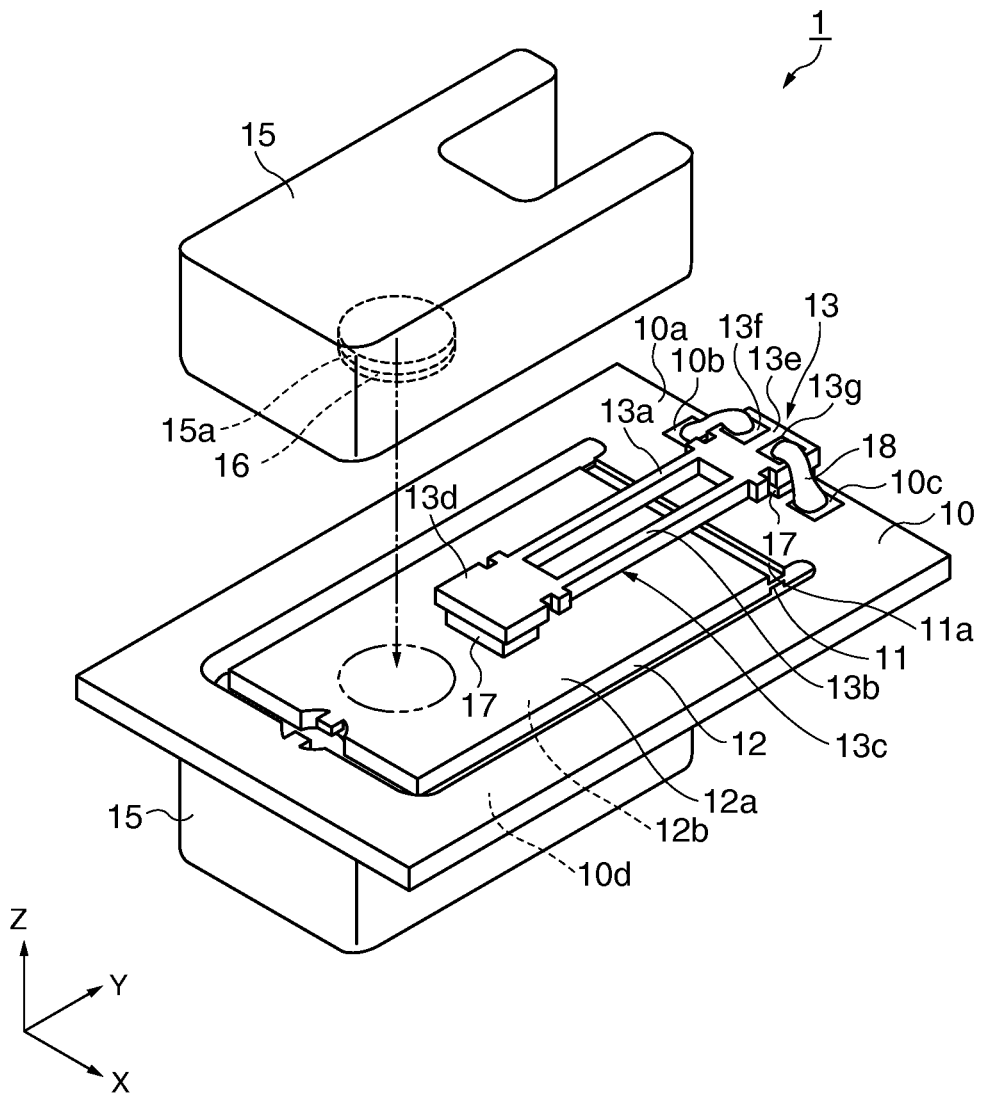
FIG. 1 is a partly developed schematic perspective view showing a schematic configuration of a physical quantity detector according to an embodiment.
Figure 2A:
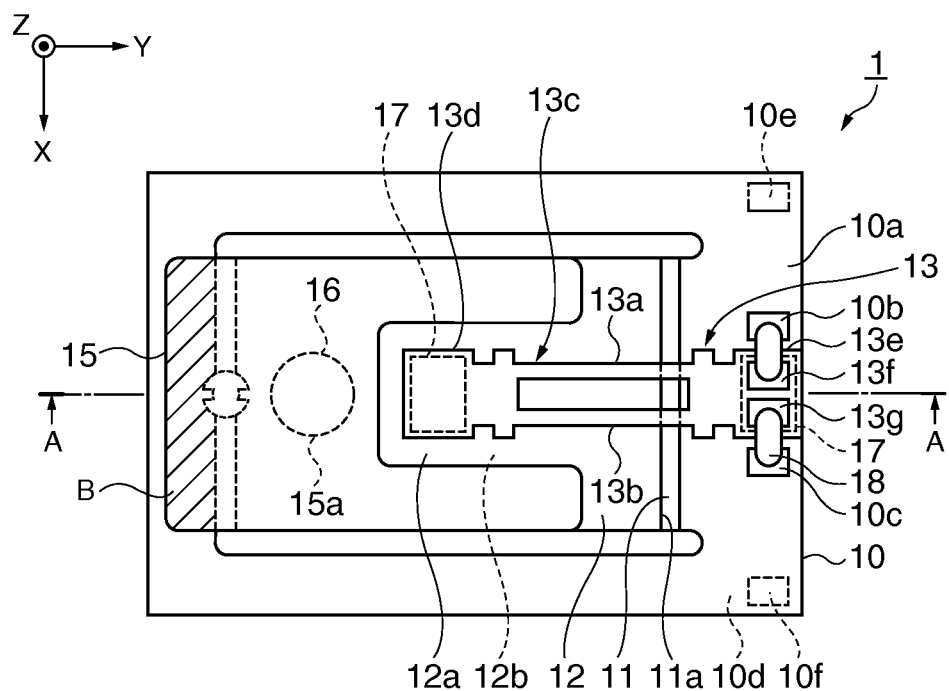
FIGS. 2A and 2B are schematic views showing a schematic configuration of the physical quantity detector according to the embodiment.
Figure 2B:
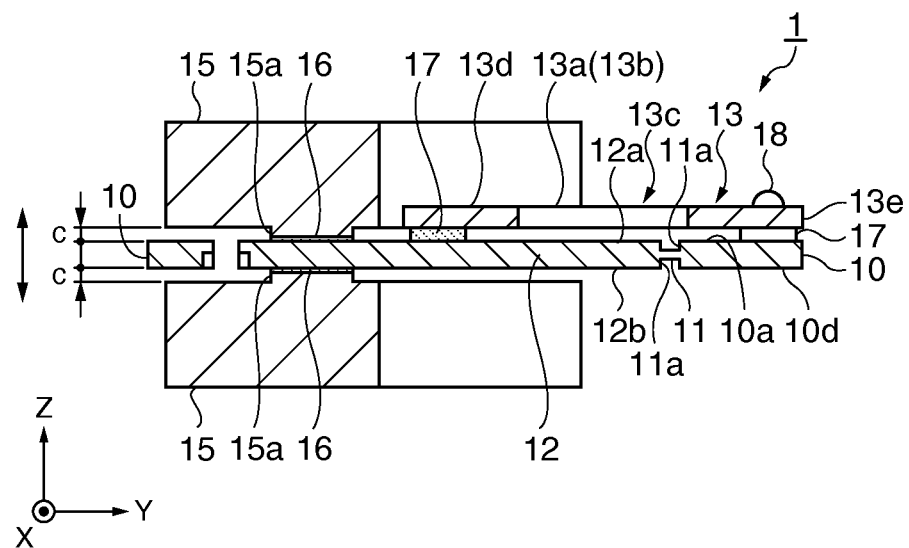

FIG. 1 is a partly developed schematic perspective view showing a schematic configuration of an acceleration detector as an example of the physical quantity detector according to this embodiment. FIGS. 2A and 2B are schematic plan and sectional views showing a schematic configuration of the acceleration detector according to this embodiment. FIG. 2A is a plan view. FIG. 2B is a sectional view taken along line A-A in FIG. 2A. Wirings are omitted and dimensional proportions of individual components are different from reality.

As shown in FIG. 1 and FIGS. 2A and 2B, an acceleration detector 1 includes a flat frame-like base part 10, a rectangular flat plate-like moving part 12 which is arranged inside the frame of the base part 10 and has one end thereof (fixed end)

connected to the base part 10 vie a joint part 11, and an acceleration detection element 13 as a physical quantity detection element laid on the base part 10 and the moving part 12 across the joint part 11.

On both main surfaces 12a, 12b of the moving part 12, which are equivalent to the front and back sides of the flat plate, a pair of mass parts (weights) 15 is arranged partly overlapping an area of the base part 10 on the other end (free end) side of the moving part 12 as viewed in a plan view. The mass parts 15 are bonded to the main surfaces 12a, 12b via a bonding member 16.

The base part 10, the joint part 11 and the moving part 12 are formed in the shape of a unitary and substantially flat plate, for example, using a crystal substrate sliced out of a crystal ore or the like at a predetermined angle. Between the moving part 12 and the base part 10, except for the one end side connected via the joint part 11, a slit-like hole that separates the moving part 12 and the base part 10 is provided.

The outer shapes of the base part 10, the joint part 11 and the moving part 12 are formed with high precision, using a technique such as photolithography or etching.

On the joint part 11, groove parts 11a with a closed bottom are formed along a direction (X-axis direction) orthogonal to a direction (Y-axis direction) of connecting the base part 10 and the moving part 12 so as to mark off the base part 10 and the moving part 12, by half-etching from the sides of the two main surfaces 12a, 12b.

With the groove parts 11a, the sectional shape of the joint part 11 along the Y-axis direction (the shape shown in FIG. 2B) is substantially H-shaped.

With this joint part 11, the moving part 12 is displaceable (rotatable) in a direction (Z-axis direction) intersecting with the main surface 12a about the joint part 11 as a fulcrum (rotation axis) according to the acceleration applied to the direction (Z-axis direction) intersecting with the main surface 12a (12b).

The mass part 15 has a columnar (disc-like) protrusion 15a protruding toward the main surface 12a (12b) of the moving part 12. A distal end of the protrusion 15a is bonded to the main surface 12a (12b) of the moving part 12 via the bonding member 16.

In view of restraining thermal stress, the protrusion 15a may preferably have a planar size as small as possible while securing a necessary area for bonding to the moving part 12. Also, in view of avoiding inclination at the time of bonding, the center of gravity of the mass part 15 may preferably fall within the protrusion 15a as viewed in a plan view.

The mass part 15 extends to the vicinity of the joint part 11 in a bifurcated shape avoiding the acceleration detection element 13 from the free end side of the moving part 12 opposite to the joint part 11 side and is thus substantially U-shaped as viewed in a plan view, so that the planar size thereof can be as large as possible to improve sensitivity of the acceleration detector 1.

For the mass part 15, for example, a material with a relatively large specific gravity, represented by metals such as Cu and Au, is used.

For the bonding member 16, for example, a silicone-based thermosetting adhesive is used as an adhesive containing a silicone-based resin (modified silicone resin or the like) with excellent elasticity.

In the acceleration detector 1, a gap C is provided between the mass part 15 and the base part 10, as shown in FIG. 2B, in an area B (the shaded part in FIG. 2A) where the mass part 15 and the base part 10 overlap each other. In this embodiment, the gap C is managed by the thickness (protruding height) of the protrusion 15a.

The acceleration detection element 13 includes an acceleration detection part 13c having at least one or more (in this example, two) prismatic resonating beams 13a, 13b which extend along the direction (Y-axis direction) of connecting the base part 10 and the moving part 12 and bend and vibrate in the X-axis direction, and a pair of basal parts 13d, 13e connected to both ends of the acceleration detection part 13c.

The acceleration detection element 13 is called a double-ended tuning fork-type piezoelectric resonator element (double-ended tuning fork element, double-ended turning fork-type resonator) because the two resonating beams 13a, 13b and the pair of basal parts 13d, 13e form two turning forks using a piezoelectric material.

In the acceleration detection element 13, the acceleration detection part 13c and the basal parts 13d, 13e are integrally formed substantially in the form of a flat plate, for example, using a crystal substrate sliced out at a predetermined angle from a crystal ore or the like. The outer shape of the acceleration detection element 13 is formed with high precision by a technique such as photolithography or etching.

The acceleration detection element 13 has one basal part 13d fixed on the side of the main surface 12a of the moving part 12 via a bonding member 17, for example, a low-melting glass, Au/Sn alloy coating capable of eutectic bonding or the like, and has the other basal part 13e fixed on the side of a main surface 10a of the base part 10 (the same side as the main surface 12a of the moving part 12) via the bonding member 17.

A predetermined gap is provided between the acceleration detection element 13, and the main surface 10a of the base part 10 and the main surface 12a of the moving part 12, so that the acceleration detection element 13, and the base part 10 and the moving part 12 do not contact each other when the moving part 12 is displaced. In this embodiment, this gap is managed by the thickness of the bonding member 17.

Specifically, the gap can be managed within a predetermined range, for example, by fixing the base part 10 and the moving part 12, and the acceleration detection element 13 to each other via the bonding member 17 in the state where a spacer formed to a thickness equivalent to the predetermined gap is inserted between the base part 10 and the moving part 12, and the acceleration detection element 13. A method for manufacturing the acceleration detector 1 will be described later.

In the acceleration detection element 13, lead-out electrodes 13f, 13g led out to the basal part 13e from excitation electrodes (drive electrodes), not shown, of the resonating beams 13a, 13b are connected to connection terminals 10b, 10c provided on the main surface 10a of the base part 10, for example, by an electrically conductive adhesive (for example, silicone-based electrically conductive adhesive) 18 containing an electrically conductive material such as a metal filler.

More specifically, the lead-out electrode 13f is connected to the connection terminal 10b, and the lead-out electrode 13g is connected to the connection terminal 10c.

The connection terminals 10b, 10c on the base part 10 are connected to external connection terminals 10e, 10f provided on a main surface 10d opposite to the main surface 10a of the base part 10 by wires, not shown. More specifically, the connection terminal 10b is connected to the external connection terminal 10e, and the connection terminal 10c is connected to the external connection terminal 10f.

The excitation electrodes, the lead-out electrodes 13f, 13g, the connection terminals 10b, 10c and the external connection terminals 10e, 10f are configured, for example, with Cr as an underlying layer and Au stacked thereon.

Here, operations of the acceleration detector 1 will be described.

Figure 3A:
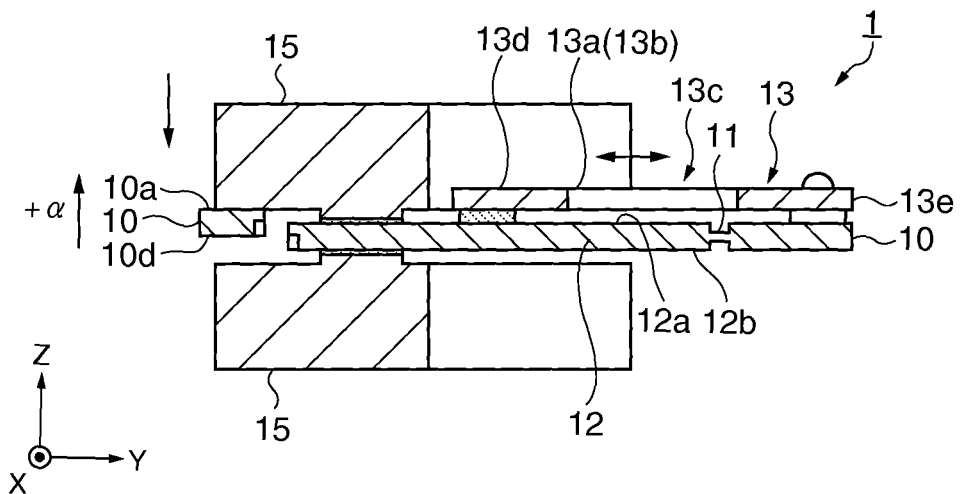
FIGS. 3A and 3B are schematic sectional views for explaining an operation of the physical quantity detector.
Figure 3B:
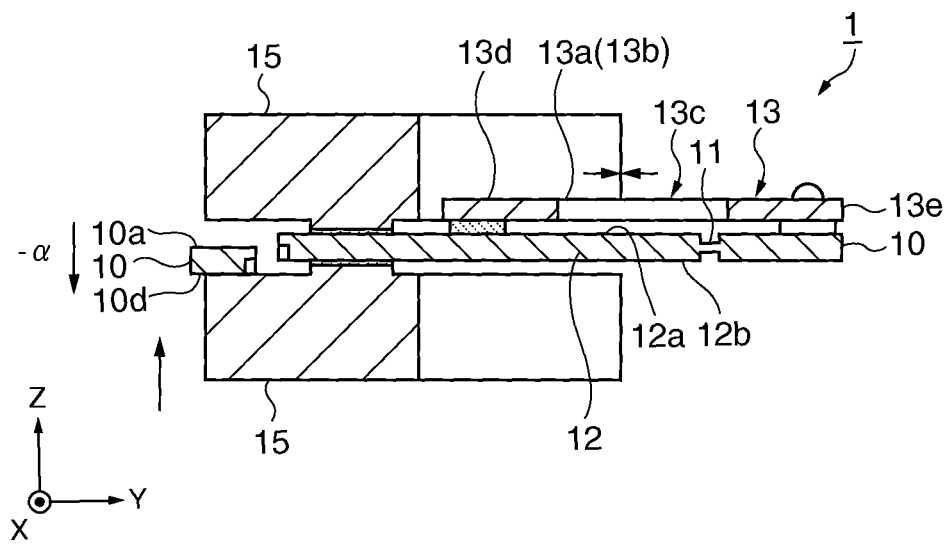

FIGS. 3A and 3B are schematic sectional views for explaining operations of the acceleration detector. FIG. 3A shows the state where the moving part is displaced downward in the drawing (−Z direction). FIG. 3B shows the state where the moving part is displaced upward in the drawing (+Z direction).

In the acceleration detector 1, as shown in FIG. 3A, when the moving part 12 is displaced in −Z direction about the joint part 11 as a fulcrum by an inertial force corresponding to acceleration +α applied in Z-axis direction, a tensile force in a direction in which the basal part 13d and the basal part 13e move away from each other in Y-axis direction is applied to the acceleration detection element 13, and tensile stress is generated on the resonating beams 13a, 13b of the acceleration detection part 13c.

Thus, in the acceleration detector 1, the resonation frequency (hereinafter also referred to as resonance frequency) of the resonating beams 13a, 13b of the acceleration detection part 13c changes to higher side, for example, like wound-up strings of a string instrument.

Meanwhile, in the acceleration detector 1, as shown in FIG. 3B, when the moving part 12 is displaced in +Z direction about the joint part 11 as a fulcrum by an inertial force corresponding to acceleration −α applied in Z-axis direction, a compressive force in a direction in which the basal part 13d and the basal part 13e approach each other in Y-axis direction is applied to the acceleration detection element 13, and compressive stress is generated on the resonating beams 13a, 13b of the acceleration detection part 13c.

Thus, in the acceleration detector 1, the resonance frequency of the resonating beams 13a, 13b of the acceleration detection part 13c changes to lower side, for example, like loosened strings of a string instrument.

The acceleration detector 1 is configured to be capable of detecting this change in resonance frequency. The acceleration (+α, −α) applied in Z-axis direction is derived by conversion to a numeric value defined by a lookup table or the like according to the rate of the detected change in resonance frequency.

Here, in the acceleration detector 1, as shown in FIG. 3A, when the acceleration +α applied in Z-axis direction is greater than a predetermined magnitude, a portion that overlaps the base part 10 as viewed in a plan view, of the mass part 15 fixed to the main surface 12a of the moving part 12, contacts the main surface 10a of the base part 10.

Thus, in the acceleration detector 1, the displacement of the moving part 12 displaced in −Z direction according to the acceleration +α is regulated within a predetermined range (equivalent to the gap C; see FIG. 2B).

Meanwhile, in the acceleration detector 1, as shown in FIG. 3B, when the acceleration −α applied in Z-axis direction is greater than a predetermined magnitude, a portion that overlaps the base part 10 as viewed in a plan view, of the mass part 15 fixed to the main surface 12b of the moving part 12, contacts the main surface 10d of the base part 10.

Thus, in the acceleration detector 1, the displacement of the moving part 12 displaced in −Z direction according to the acceleration −α is regulated within a predetermined range (equivalent to the gap C; see FIG. 2B).

Next, an example of a method for manufacturing the acceleration detector 1 will be described.

Figure 4:
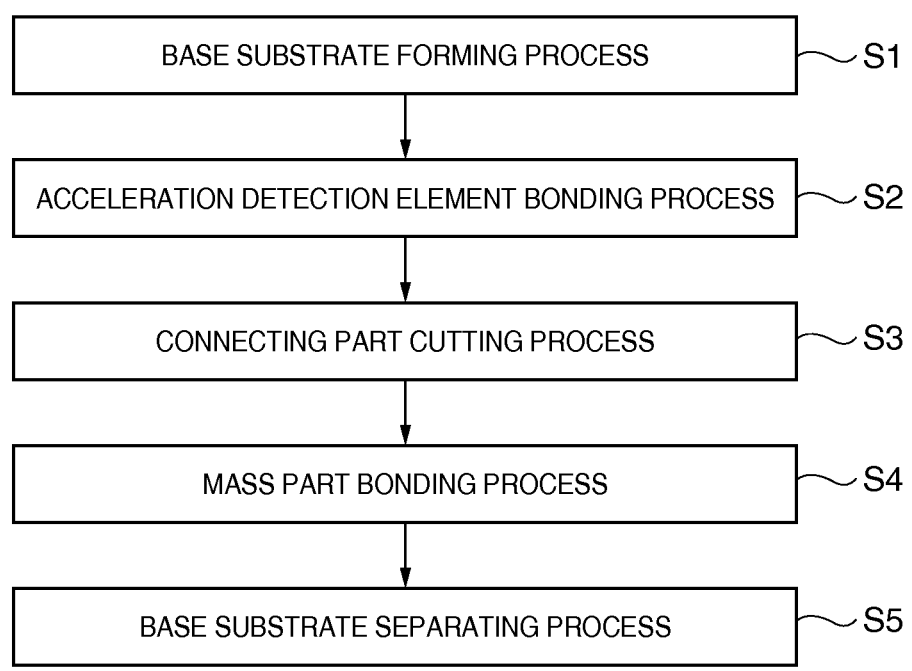
FIG. 4 is a flowchart showing an example of manufacturing processes for the physical quantity detector.

FIG. 4 is a flowchart showing an example of manufacturing processes for the acceleration detector. FIGS. 5A to 8B are schematic views for explaining each main manufacturing process.

As shown in FIG. 4, the manufacturing method for the acceleration detector 1 includes a base substrate forming process S1, an acceleration detection element bonding process S2, a connecting part cutting process S3, a mass part bonding process S4, and a base substrate separating process S5.

Base Substrate Forming Process S1

Figure 5A:
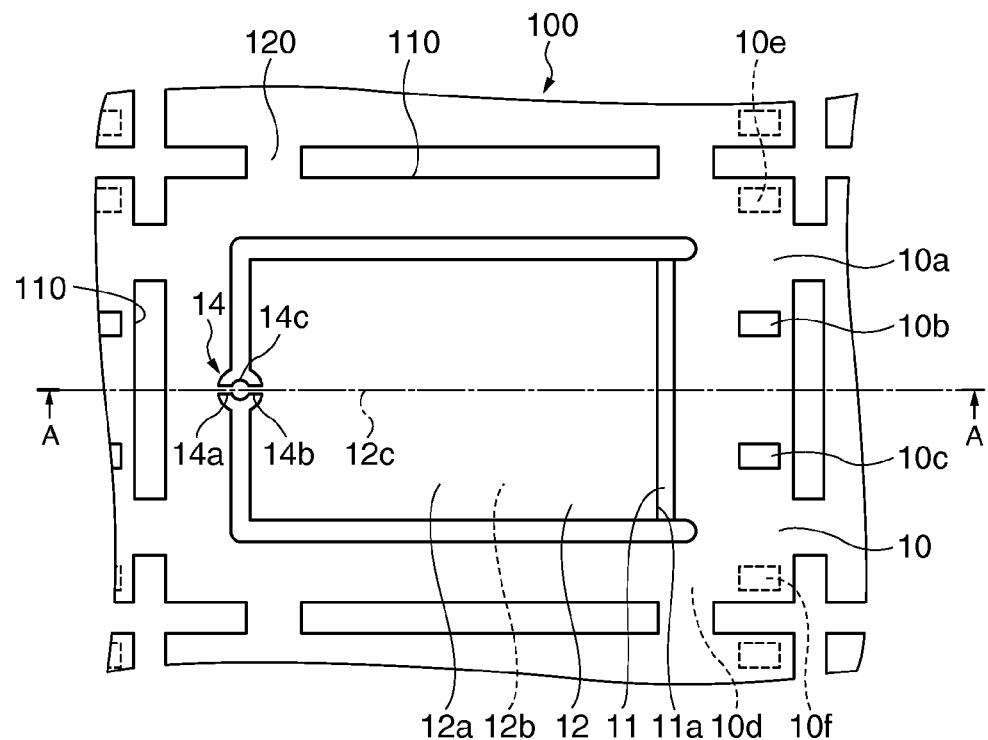
FIGS. 5A and 5B are schematic views for explaining a base substrate forming process.
Figure 5B:
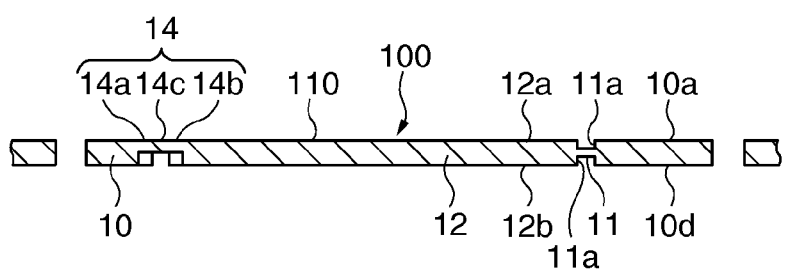

First, as shown in the schematic views of FIGS. 5A and 5B for explaining the base substrate forming process, a base substrate 110 as a unitary member including the base part 10, the joint part 11, the moving part 12 and a connecting part 14 provided on a free end side of the moving part 12 and connecting the base part 10 and the moving part 12 to each other is formed by a technique such as photolithography or wet etching, for example, using a crystal substrate (wafer) 100 sliced out at a predetermined angle from a crystal ore or the like.

The base substrate 110 is connected to a neighboring base substrate 110 via a connection beam (equivalent to a separation tab) 120. Thus, plural base substrates 110 are taken out of the single crystal substrate 100.

Here, the connecting part 14 is preferably made thinner than the base part 10 and the moving part 12. In this case, the connecting part 14 is preferably processed only on one side thereof (the side of the main surface 10d of the base part 10, the side of the main surface 12b of the moving part 12) by wet etching or the like and thus made thinner than the base part 10 and the moving part 12.

Moreover, the connecting part 14 is configured to have narrow parts 14a, 14b on the side of the base part 10 and on the side of the moving part 12, for example, as viewed in a plan view or a side view. However, in this embodiment, considering that the thickness of the connecting part 14 is thin, the narrow parts 14a, 14b are preferably formed on the side of the base part 10 and on the side of the moving part 12 as viewed in a plan view, so as not to make the thickness of the narrow parts 14a, 14b extremely thin.

In this case, the narrow parts 14a, 14b of the connecting part 14 are preferably formed in such a way as to cut into the base part 10 and the moving part 12 as viewed in a plane view.

In other words, the narrow parts 14a, 14b of the connecting part 14 are preferably formed, for example, in a space provided by arcuately boring the lateral sides facing each other of the base part 10 and the moving part 12 as viewed in a plan view.

A substantially circular removal part 14c that is concentric with the arc is preferably formed between the narrow part 14a and the narrow part 14b.

The connecting part 14 is preferably formed in such a way as to overlap a center line 12c along a direction connecting the moving part 12 and the base part 10, on the moving part 12, as viewed in a plan view.

The reasons for the above being preferable will be described later.

An example of the thickness of each part of the base substrate 110 may be approximately 100 to 200 μm for the base part 10 and the moving part 12, approximately 20 μm for the joint part 11, and approximately 40 μm for the connecting part 14. The joint part 11 is formed by half etching from the sides of the two main surfaces 12a, 12b.

Acceleration Detection Element Bonding Process S2

Figure 6A:
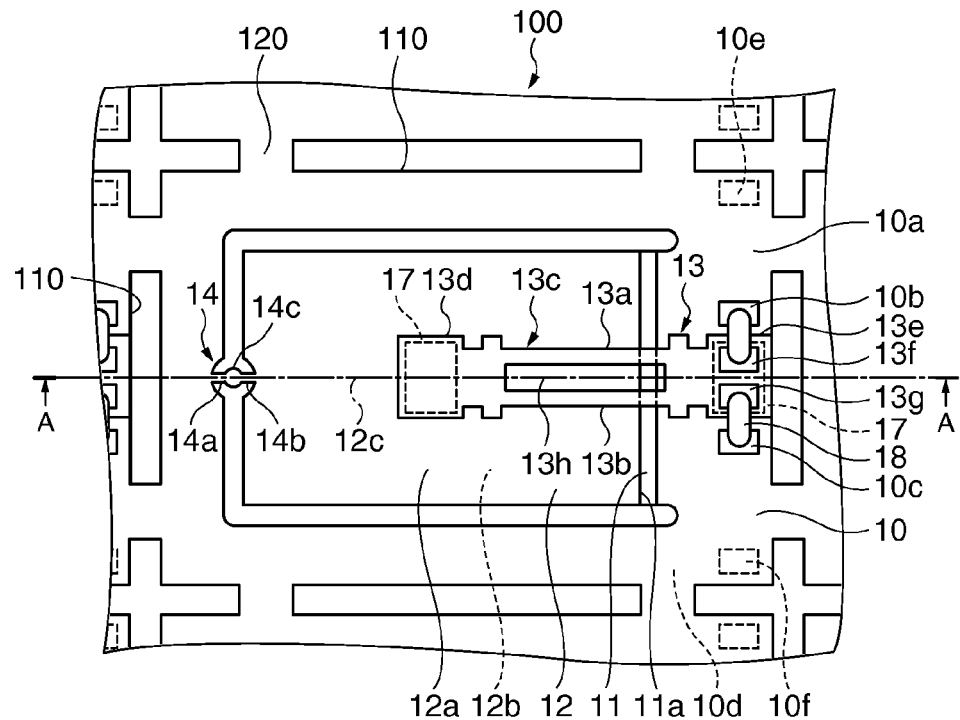
FIGS. 6A and 6B are schematic views for explaining an acceleration detection element bonding process.
Figure 6B:
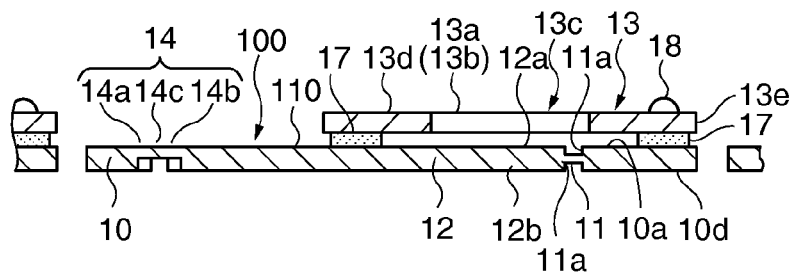

Next, as shown in the schematic views of FIGS. 6A and 6B for explaining the acceleration detection element bonding process, the acceleration detection element 13 is laid and fixed on the base part 10 and the moving part 12.

Specifically, the one basal part 13d of the acceleration detection element 13 is fixed (bonded) to the main surface 12a of the moving part 12 via the bonding member 17, for example, a low-melting glass, Au/Sn alloy coating capable of eutectic bonding or the like. The other basal part 13e is fixed to the main surface 10a of the base part 10 via the bonding member 17.

In view of improving detection characteristics such as sensitivity and accuracy of acceleration detection, it is preferable to fix the acceleration detection element 13 in such a way that a center line 13h along a direction connecting the moving part 12 and the base part 10 overlaps the center line 12c on the moving part 12 as viewed in a plan view.

Here, as described above, a predetermined gap is provided between the acceleration detection element 13, and the main surface 10a of the base part 10 and the main surface 12a of the moving part 12, so that the acceleration detection element 13, and the base part 10 and the moving part 12 do not contact each other when the moving part 12 is displaced. In this embodiment, this gap is managed by the thickness of the bonding member 17.

Specifically, the gap is managed within a predetermined range, for example, by fixing the base part 10 and the moving part 12, and the acceleration detection element 13 to each other via the bonding member 17 in the state where a spacer formed to a thickness equivalent to the predetermined gap is inserted between the base part 10 and the moving part 12, and the acceleration detection element 13 and then removing the spacer after setting the boding member 17.

Next, the lead-out electrodes 13f, 13g of the acceleration detection element 13 are connected to the connection terminals 10b, 10c provided on the main surface 10a of the base part 10, for example, via the electrically conductive adhesive (for example, silicone-based electrically conductive adhesive) 18 containing an electrically conductive material such as a metal filler.

More specifically, first, the electrically conductive adhesive 18 is applied in such a way as to spread over the lead-out electrode 13f and the connection terminal 10b, and the electrically conductive adhesive 18 is applied in such a way as to spread over the lead-out electrode 13g and the connection terminal 10c.

Then, the electrically conductive adhesive 18 is heated and set. Thus, the lead-out electrode 13f and the connection terminal 10b are electrically connected to each other, and the lead-out electrode 13g and the connection terminal 10c are electrically connected to each other.

In this process, the lead-out electrodes 13f, 13g and the connection terminals 10b, 10c may be electrically connected to each other by wire bonding using a metal wire instead of the electrically conductive adhesive 18.

Connecting Part Cutting Process S3

Figure 7A:
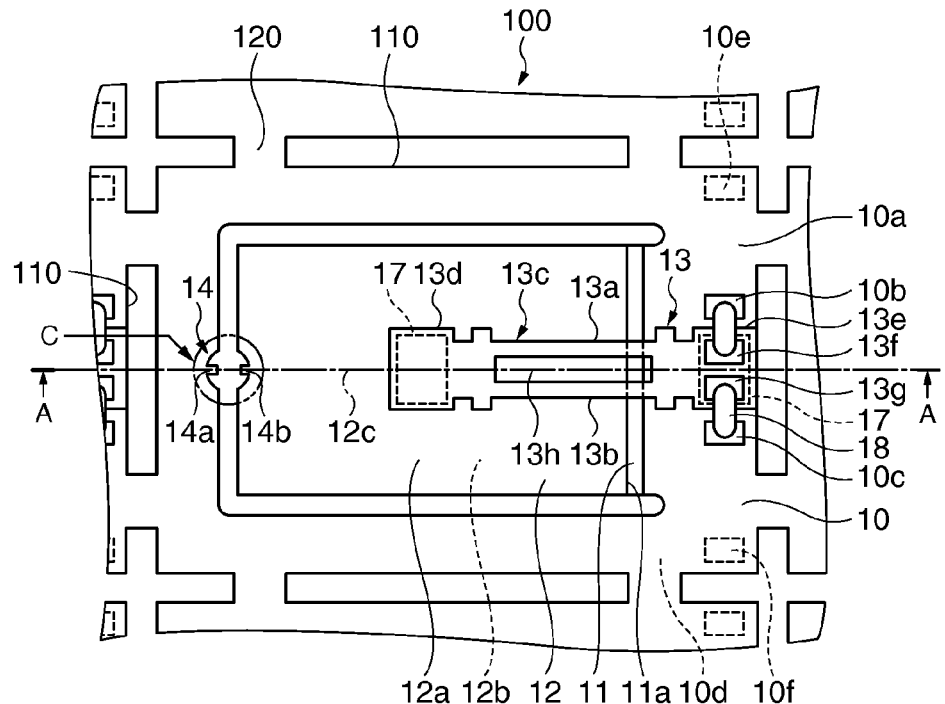
FIGS. 7A to 7C are schematic views for explaining a connecting part cutting process.
Figure 7B:
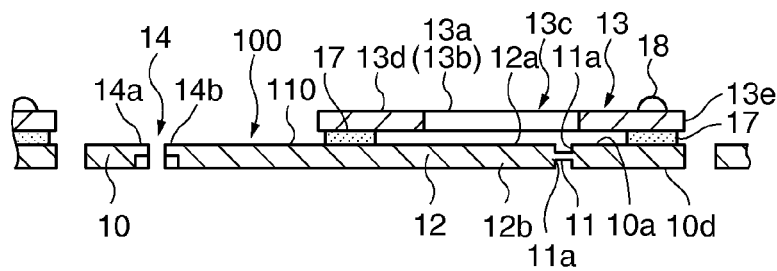
Figure 7C:
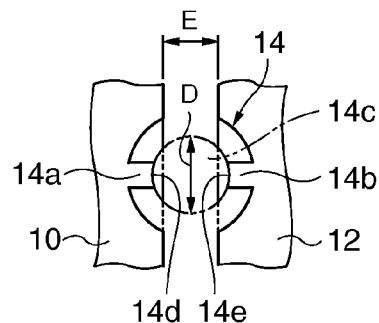

Next, as shown in the schematic views of FIGS. 7A to 7C for explaining the connecting part cutting process, the connecting part 14 of the base substrate 110 is cut off.

Specifically, for example, using a cutting device having a narrow columnar protrusion, not shown, the removal part 14c of the connecting part 14 is pressed by the protrusion of the cutting device from the side of the main surface 10a of the base part 10, and the removal part 14c is thus cut off (separated from) the narrow part 14a and the narrow part 14b. At this point, the narrow parts 14a, 14b may be cut off the base part 10 and the moving part 12, together with the removal part 14c.

Here, a diameter D of the removal part 14c is preferably greater than a space E between the base part 10 and the moving part 12. Thus, when the connecting part 14 is cut off, cut-off surfaces 14d, 14e of the narrow parts 14a, 14b can be prevented from protruding outward from contours of the base part 10 and the moving part 12 (straight lines connected by double chain dotted lines in FIG. 7C).

Mass Part Bonding Process S4

Figure 8A:
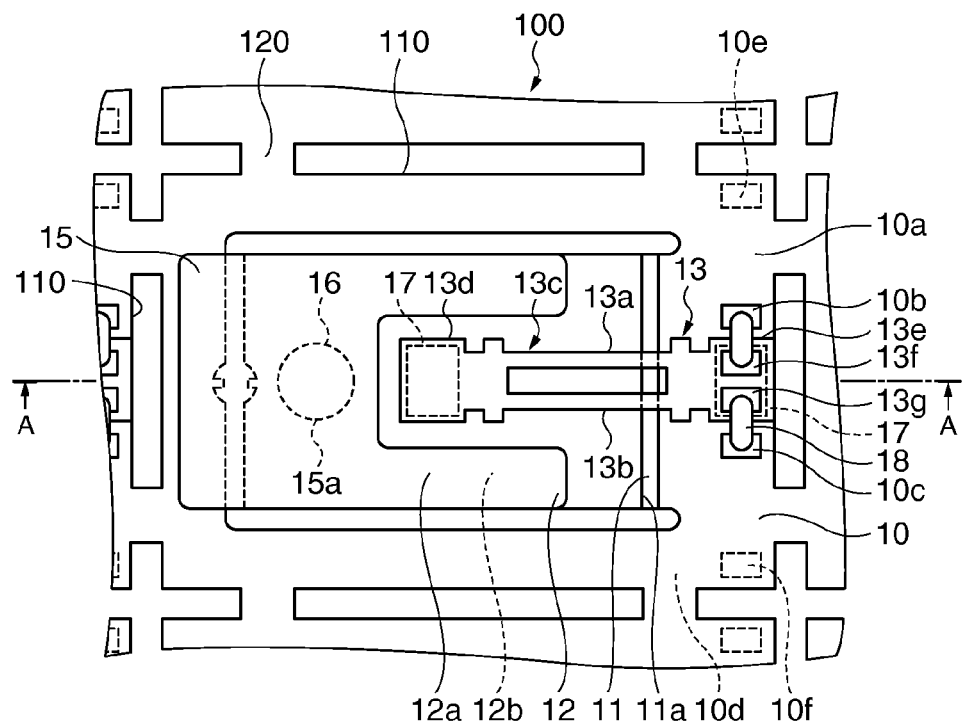
FIGS. 8A and 8B are schematic views for explaining a mass part bonding process.
Figure 8B:
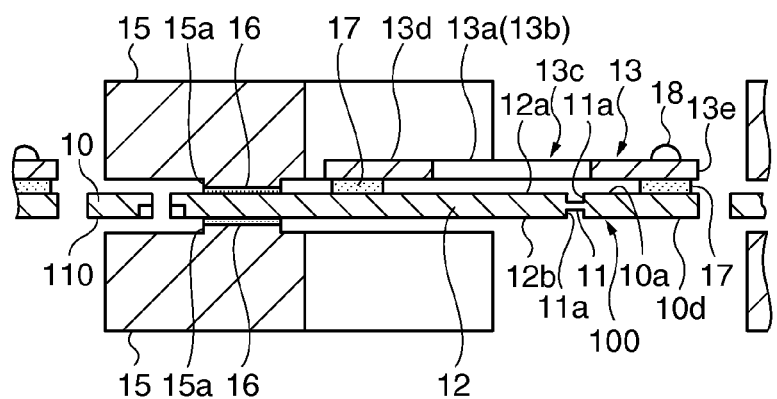

Next, as shown in the schematic views of FIGS. 8A and 8B, the mass part 15 is fixed (bonded) to the main surface 12a (12b) of the moving part 12 via the bonding member 16.

Specifically, first, the bonding member 16 containing a silicone-based resin (modified silicone resin or the like) with excellent elasticity, for which, for example, a silicone-based thermosetting adhesive is used, is applied in a predetermined quantity to the flat surface at the distal end of the protrusion 15a of the mass part 15 by an application device such as a dispenser.

Then, the mass part 15 is aligned so that the protrusion 15a is situated on the side of the main surface 12a (12b) of the moving part 12, and the mass part 15 is thus arranged on the moving part 12.

Then, the bonding member 16 is heated and set, thus fixing (bonding) the mass part 15 to the main surface 12a (12b) of the moving part 12.

At this point, in view of avoiding inclination of the mass part 15, the center of gravity of the mass part 15 preferably falls within the protrusion 15a as viewed in a plan view, as described.

Base Substrate Separating Process S5

Next, the connection beam 120 is cut off by the cutting device, not shown, and the base substrate 110 is separated as an individual member from the crystal substrate 100. Thus, the acceleration detector 1 as shown in FIG. 1 and FIGS. 2A and 2B is acquired.

The above processes may be properly switched in order within an allowable range that causes no trouble. For example, the mass part bonding process S4 may be separately carried out after the base substrate 110 is provided as an individual member in the base substrate separating process S5.

Also, other processes than the above, such as a preparation process, an inspection process and an adjustment process, may be properly carried out before or after the above processes.

As described above, the manufacturing method for the acceleration detector 1 includes the base substrate forming process S1 for integrally forming the base part 10, the joint part 11, the moving part 12 and the connecting part 14, the acceleration detection element bonding process S2 for laying and fixing the acceleration detection element 13 on the base part 10 and the moving part 12, and the connecting part cutting process S3 for cutting off the connecting part 14.

In the manufacturing method for the acceleration detector 1, since the connecting part 14 connecting the base part 10 and the moving part 12 to each other is formed, flexure of the moving part 12 when an external force is applied, for example, when the base substrate 110 is formed by wet etching or when the acceleration detection element 13 is fixed to the moving part 12, can be restrained by the connecting part 14.

Consequently, in the manufacturing method for the acceleration detector 1, damage to the moving part 12 and the joint part 11 in the manufacturing processes can be reduced and productivity of the acceleration detector 1 can be improved.

In the manufacturing method for the acceleration detector 1, the connecting part cutting process S3 for cutting off the connecting part 14 is carried out after the acceleration detection element bonding process S2 for laying and fixing the acceleration detection element 13 on the base part 10 and the moving part 12.

Therefore, in the manufacturing method for the acceleration detector 1, flexure of the moving part 12 due to an external force applied when the acceleration detection element 13 is laid and fixed on the base part 10 and the moving part 12 can be restrained by the connecting part 14.

Consequently, in the manufacturing method for the acceleration detector 1, damage to the moving part 12 and the joint part 11 in the acceleration detection element bonding process S2 for laying and fixing the acceleration detection element 13 on the base part 10 and the moving part 12 can be reduced and productivity of the acceleration detector 1 can be improved.

Also, in the manufacturing method for the acceleration detector 1, since the connecting part 14 is made thinner than the base part 10 and the moving part 12, the connecting part 14 can be cut off without adversely affecting the base part 10 and the moving part 12 (without causing failure therein) in the connecting part cutting process S3 for cutting off the connecting part 14.

Moreover, in the connecting part cutting process S3, when the crystal substrate 100 is placed in advance on a flat surface such as a stand and is then worked, the main surface 10*b* is in contact with the stand. However, since the connecting part 14 is made thinner than the base part 10 and the moving part 12, there is a gap between the surface on the side of the main surface 10*b* of the removal part 14*c* and the stand.

Therefore, when the removal part 14*c* is pressed toward the main surface 10*b* by the protrusion of the cutting device, the removal part 14*c* can be displaced into the gap and accordingly the narrow part 14*a* and the narrow part 14*b* can be sufficiently flexed for cutting.

Moreover, in the manufacturing method for the acceleration detector 1, the connecting part 14 is processed only on the one side thereof (on the side of the main surface 10*d*) and is made thinner than the base part 10 and the moving part 12. Therefore, less time and effort is required than in processing from both side, for example, the masking shape in wet etching becomes simpler, and the connecting part 14 can be formed easily.

Also, in the manufacturing method for the acceleration detector 1, the connecting part 14 is formed having the narrow parts 14*a*, 14*b* on the side of the base part 10 and on the side of the moving part 12 as viewed in a plan view. Therefore, the connecting part 14 can be cut off at the two narrow parts 14*a*, 14*b* having less strength than the peripheries, and therefore a predetermined gap (space) can be secured between the base part 10 and the moving part 12.

Consequently, in the manufacturing method for the acceleration detector 1, interference between the base part 10 and the moving part 12 when the moving part 12 is displaced can be securely avoided.

Moreover, in the manufacturing method for the acceleration detector 1, the narrow parts 14*a*, 14*b* of the connecting part 14 are formed in such a way as to cut into the base part 10 and the moving part 12 as viewed in a plan view. Therefore, the cut-off surfaces 14*d*, 14*e* after the cutting of the narrow parts 14*a*, 14*b* of the connecting part 14 can be prevented from protruding outward from the contours of the base part 10 and the moving part 12.

Consequently, in the manufacturing method for the acceleration detector 1, since the remaining part after the cutting of the connecting part 14 does not affect the space E between the base part 10 and the moving part 12 (the space E between the base part 10 and the moving part 12 does not depend on the positions of the cut-off surfaces 14*d*, 14*e* after the cutting), the predetermined space E can be reliably secured between the base part 10 and the moving part 12.

Thus, in the manufacturing method for the acceleration detector 1, interference between the base part 10 and the moving part 12 when the moving part 12 is displaced can be avoided more securely.

Also, in the manufacturing method for the acceleration detector 1, the connecting part 14 is formed in such a way as to overlap the center line 12*c* along the direction connecting the moving part 12 and the base part 10 to each other, on the moving part 12, as viewed in a plan view. Therefore, good supporting balance of the moving part 12 by the connecting part 14 can be achieved.

Consequently, in the manufacturing method for the acceleration detector 1, the moving part 12 is harder to flex than in the case where the connecting part 14 does not overlap the center line 12*c*. Therefore, damage to the moving part 12 and the joint part 11 in the manufacturing processes can be reduced securely.

The connecting part 14 is not limited to the above arrangement. For example, arrangements as shown in the schematic plan views of FIGS. 9A and 9B showing variations of the connecting part may also be employed.

Figure 9A:
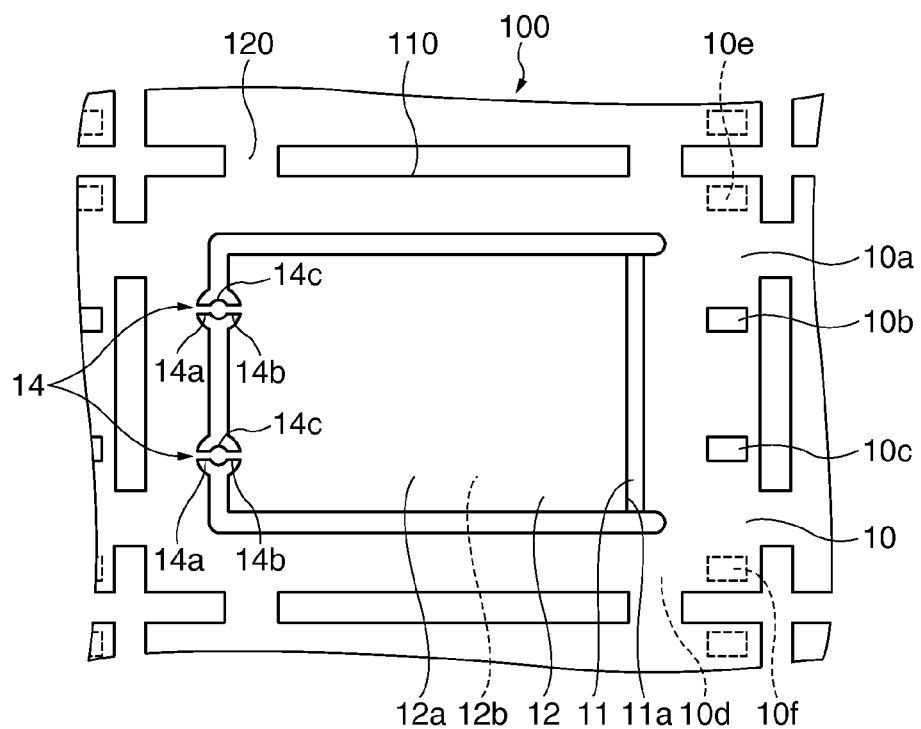
FIGS. 9A and 9B are schematic plan views showing variations of the connecting part.

The connecting part 14 may be provided at two positions on the short sides of the base part 10 and the moving part 12 on the free end side of the moving part 12, as shown in FIG. 9A.

According to this arrangement, in the manufacturing method for the acceleration detector 1, since the connecting part 14 is provided at two positions, the moving part 12 is harder to flex than in the case where the connecting part 14 is provided at one position, and damage to the moving part 12 and the joint part 11 in the manufacturing processes can be reduced more securely.

Figure 9B:
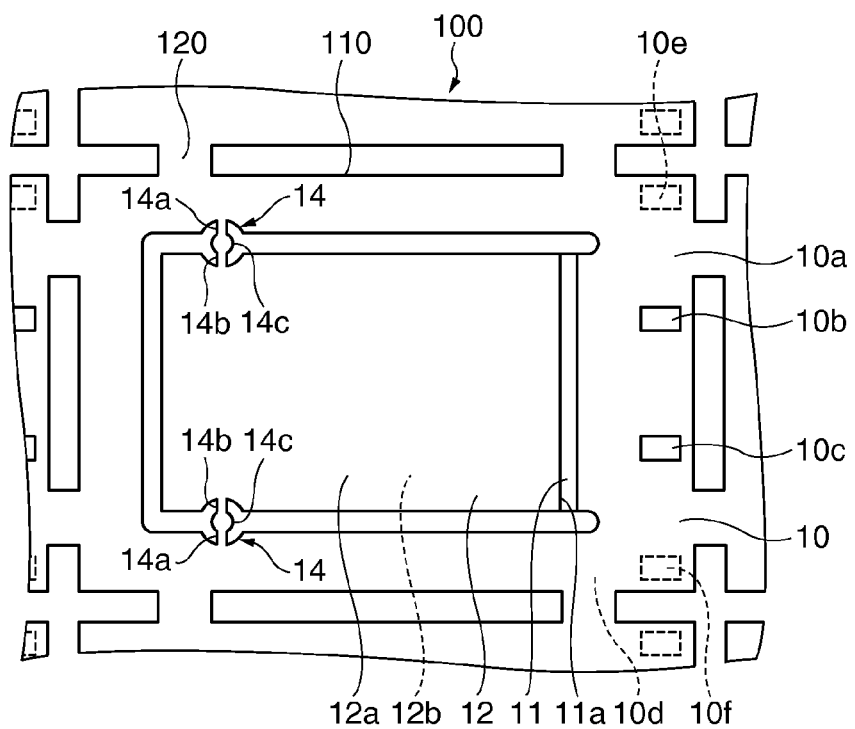

Alternatively, the connecting part 14 may be provided at one position each on both long sides (upper side and lower side in the drawing) of the base part 10 and the moving part 12 on the free end side of the moving part 12, as shown in FIG. 9B.

According to this arrangement, in the manufacturing method for the acceleration detector 1, since the connecting part 14 is provided at one position each on both long sides of the base part 10 and the moving part 12, the mass part 15 and the removal part 14*c* of the connecting part 14 can be prevented from overlapping each other as viewed in a plan view.

Thus, in the manufacturing method for the acceleration detector 1, since the connecting part cutting process S3 can be carried out after the mass part bonding process S4, damage to the moving part 12 and the joint part 11 in the mass part bonding process S4 can be reduced.

The connecting part 14 may be processed to be thin from the side of the main surface 10*a* instead of the side of the main surface 10*d* of the base part 10, or may be processed to be thin from the sides of the two main surfaces 10*a*, 10*d*.

In this case, the main surface 10*a* on the connecting part 14 is situated a retreated position from the main surface 10*a* on the base part 10 and the moving part 12. Therefore, there is an advantage that the protrusion of the cutting device is stable in the connecting part cutting process S3.

Moreover, the connecting part 14 need not have the narrow parts 14*a*, 14*b* if there is no problem with cutting. Alternatively, the narrow parts 14*a*, 14*b* need not be formed in such a way as to cut into the base part 10 and the moving part 12 if there is no problem with securing the space between the base part 10 and the moving part 12.

Also, the shape of the removal part 14*c* of the connecting part 14 need not be substantially circular. For example, an arbitrary shape such as elliptical, triangular or quadrilateral shape may be employed without causing any problem with cutting.

Moreover, by making the removal part 14c of the connecting part 14 thicker than the narrow parts 14a, 14b, rigidity of the removal part 14c may be improved and cutting within the removal part 14c (cutting to leave a portion of the removal part 14c as a remaining part) may be avoided securely in the connecting part cutting process S3.

The material of the base substrate 110 is not limited to crystal and may be glass or a semiconductor material such as silicon.

The material of the acceleration detection element is not limited to crystal and may be a piezoelectric material such as lithium tantalate ($LiTaO_3$), lithium tetraborate ($Li_2B_4O_7$), lithium niobate ($LiNbO_3$), lead zirconate titanate (PZT), zinc oxide (ZnO) or aluminum nitride (AlN), or a semiconductor material such as silicon having a coating of a piezoelectric material such as zinc oxide (ZnO) or aluminum nitride (AlN).

The invention is described above with reference to the acceleration detector as an example of a physical quantity detector. However, the invention is not limited to this example and can also be applied to physical quantity detectors for detecting a force, velocity, distance or the like from results of acceleration detection.

The entire disclosure of Japanese Patent Application No. 2011-120050, filed May 30, 2011 is expressly incorporated by reference herein.

What is claimed is:

1. A method for manufacturing a physical quantity detector comprising a base part having a flat, frame structure, a moving part having a flat, plate structure and which is arranged inside the base part and has one end thereof connected to the base part via a joint part, and a physical quantity detection element laid on the base part and the moving part across the joint part, the method comprising:
   integrally forming the base part, the joint part, the moving part, and a connecting part which is provided on the other end side of the moving part as a free end thereof and connects the base part and the moving part to each other by using at least one of crystal, glass, and silicon;
   forming the connecting part such that the connecting part includes two narrow parts and a removal part between the two narrow parts when viewed in a plan view in the thickness direction of the moving part;
   laying and fixing the physical quantity detection element on the base part and the moving part;
   pressing and cutting the connecting part so as to cut off the two narrow parts of the connecting part.

2. The method for manufacturing the physical quantity detector according to claim 1, wherein the cutting of the connecting part is carried out after the laying and fixing the physical quantity detection element on the base part and the moving part.

3. The method for manufacturing the physical quantity detector according to claim 1, wherein the connecting part is made thinner than the base part and the moving part.

4. The method for manufacturing the physical quantity detector according to claim 3, wherein the connecting part is processed only on one side thereof and thus made thinner than the base part and the moving part.

5. The method for manufacturing the physical quantity detector according to claim 1, wherein a first narrow part of the two narrow parts is on the base part side and a second narrow part of the two narrow parts is on the moving part side.

6. The method for manufacturing the physical quantity detector according to claim 5, wherein the narrow parts of the connecting part are formed in such a way as to cut into the base part and the moving part as viewed in a plan view in a direction perpendicular to a plane including the moving part and the base part.

7. The method for manufacturing the physical quantity detector according to claim 1, wherein the connecting part is formed in such a way as to overlap a center line along a direction connecting the moving part and the base part, on the moving part, as viewed in a plan view in a direction perpendicular to a plane including the moving part and the base part.

* * * * *